US008749745B2

(12) United States Patent
Park et al.

(10) Patent No.: US 8,749,745 B2
(45) Date of Patent: Jun. 10, 2014

(54) ORGANIC ELECTROLUMINESCENT DEVICE

(75) Inventors: Hongki Park, Daegu (KR); Woochan Kim, Suwon-si (KR); Hongseok Choi, Seoul (KR)

(73) Assignee: LG Display Co. Ltd., Seoul (KR)

( * ) Notice: Subject to any disclaimer, the term of this patent is extended or adjusted under 35 U.S.C. 154(b) by 1135 days.

(21) Appl. No.: 12/128,214

(22) Filed: May 28, 2008

(65) Prior Publication Data

US 2008/0297450 A1   Dec. 4, 2008

(30) Foreign Application Priority Data

Jun. 1, 2007  (KR) ......................... 10-2007-0053726

(51) Int. Cl.
*G02F 1/1345* (2006.01)
(52) U.S. Cl.
USPC ........ 349/149; 345/104; 315/168; 315/169.1; 315/169.3
(58) Field of Classification Search
USPC ............ 345/211, 76–104; 313/491, 500, 505, 313/506; 349/46, 149; 205/399; 523/118; 439/936; 315/160, 161, 163, 167, 315/169.3, 168, 169.1
See application file for complete search history.

(56) References Cited

U.S. PATENT DOCUMENTS

| | | | | |
|---|---|---|---|---|
| 5,684,555 | A * | 11/1997 | Shiba et al. | 349/149 |
| 6,697,040 | B2 * | 2/2004 | Imajo et al. | 345/98 |
| 7,202,841 | B2 * | 4/2007 | Matsumoto | 345/76 |
| 2002/0011975 | A1 * | 1/2002 | Yamazaki et al. | 345/76 |
| 2003/0146712 | A1 | 8/2003 | Inukai | |
| 2004/0041753 | A1 * | 3/2004 | Nakanishi | 345/76 |
| 2005/0023956 | A1 * | 2/2005 | Kwak et al. | 313/495 |
| 2005/0140306 | A1 * | 6/2005 | Park | 315/169.3 |
| 2006/0158095 | A1 * | 7/2006 | Imamura | 313/500 |
| 2006/0250083 | A1 * | 11/2006 | Oh et al. | 313/512 |
| 2007/0195043 | A1 * | 8/2007 | Furuie et al. | 345/92 |

FOREIGN PATENT DOCUMENTS

| | | |
|---|---|---|
| JP | 2005-128576 | 5/2005 |
| KR | 1020060059413 A | 6/2006 |
| TW | 331596 | 5/1998 |
| TW | 519606 | 2/2003 |
| TW | 200707399 | 2/2007 |

OTHER PUBLICATIONS

Author-Jens Lienig, Title-Interconnect and Current Density Stress—An Introduction to Electromigration-Aware Design, Date-Apr. 2005, Pertinent pp. 8.*
Author-Jens Lienig, Title-Interconnect and Current Density Stress—An Introduction to Electromigration-Aware Design, Date-Apr. 2005, Pertinent pp. 8.*

(Continued)

*Primary Examiner* — Alexander S Beck
*Assistant Examiner* — Amen Bogale
(74) *Attorney, Agent, or Firm* — Brinks Gilson & Lione

(57) ABSTRACT

An organic electroluminescent device comprises: a substrate; a display unit located on the substrate and including a plurality of subpixels; a sealing region located at the outer periphery of the display unit and defined to form a sealing member; and a plurality of wiring lines connected to the display unit and disposed on the lateral side of the display unit, some of the plurality of wiring lines are respectively divided into two or more in the sealing region.

16 Claims, 5 Drawing Sheets

(56) References Cited

OTHER PUBLICATIONS

Autor-Jens Lienig, Title-Interconnect and Current Density Stress—An Introduction to Electromigration-Aware Design, Date-Apr. 2005, Pertinent pp. 8*

Jens Lienig, Interconnect and Current Density Stress—An Introduction to Electromigration-Aware Design, Apr. 2005, Pertinent p. 8.*

Office Action issued in corresponding Taiwanese Patent Application No. 097119284, mailed Apr. 25, 2012.

Office Action issued in corresponding Korean Patent Application No. 10-2007-0053726, mailed Jul. 5, 2013, 3 pages.

Office Action issued in corresponding German Patent Application No. 102008025471.1, mailed Nov. 4, 2010.

Lienig, "Interconnect and Current Density Stress—An Introduction to Electromigration-Aware Design". Dresden University of Technology, Institute of Electromechanical and Electronic Design. pp. 81-88.

Office Action issued in corresponding Chinese Patent Application No. 200810108165.; issued Oct. 30, 2009.

* cited by examiner

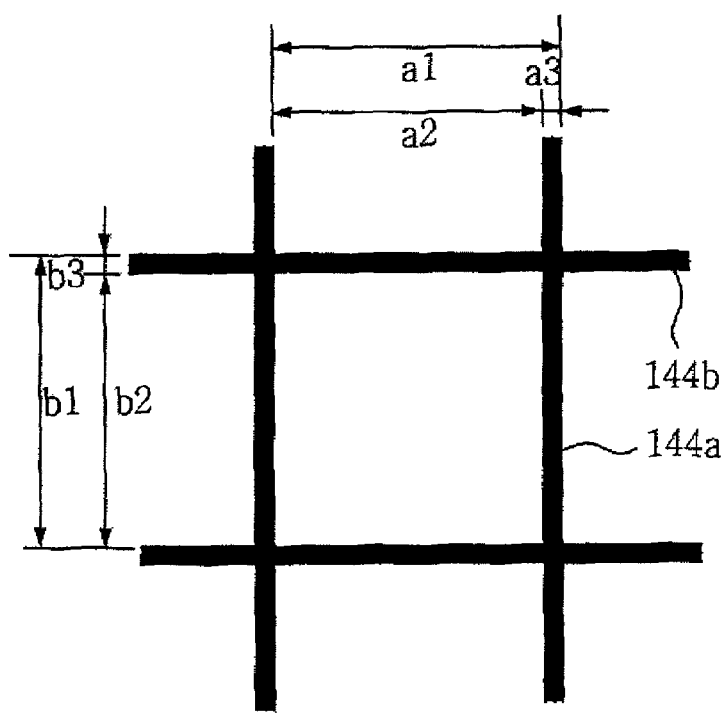

ORGANIC ELECTROLUMINESCENT DEVICE

This application claims the benefit of Korean Patent Application No. 10-2007-053726 filed ON Jun. 1, 2007, the entire content of which is hereby incorporated by reference.

BACKGROUND

1. Field

This document relates to an organic electroluminescent device.

2. Related Art

An organic electroluminescent device used for an organic electroluminescence display is a self-light emitting device which has a light emitting layer formed between two electrodes positioned on a substrate.

The organic electroluminescent device may be classified into a top emission type and a bottom emission type depending on its light emission direction. Furthermore, the organic electroluminescent device may be classified into a passive matrix type and an active matrix type depending on its driving method.

Since such an organic electroluminescent device is vulnerable to moisture or oxygen, a sealing substrate is provided in order to protect the device, and a sealing process for sealing a substrate and the sealing substrate using a sealing member, such as sealant, is performed. In the sealing process, the sealant is typically hardened by UV irradiation, thereby hermetically sealing the substrate and the sealing substrate.

In a sealing region where the sealant is disposed and UV is irradiated, a plurality of wiring lines are formed on the substrate is wired. Some of these wires inhibit the sealant from being uniformly applied onto the substrate, or inhibit UV from being effectively irradiated onto the sealant, thus leading to adverse effects in the manufacture of a device.

Furthermore, these wiring lines are power lines that have a thickness more or less than other wiring lines. They may create a wiring resistance problem or a problem of concentration of the load flowing thorough the wiring lines according to a wiring structure, and hence caution is required when forming power lines

SUMMARY

The present invention provides an organic electroluminescent device, comprising: a substrate; a display unit located on the substrate and including a plurality of subpixels; a sealing region located at the outer periphery of the display unit and defined to form a sealing member; and a plurality of wiring lines connected to the display unit and disposed on the lateral side of the display unit. Some of the wiring lines in the plurality of wiring lines are respectively divided into two or more in the sealing region.

BRIEF DESCRIPTION OF THE DRAWINGS

The accompanying drawings, which are included to provide a further understanding of the invention and are incorporated on and constitute a part of this specification, illustrate embodiments of the invention and together with the description serve to explain the principles of the invention.

FIG. 6 is an illustration of a connection relationship between a second power line and a connecting line.

DETAILED DESCRIPTION

Reference will now be made in detail embodiments of the invention examples of which are illustrated in the accompanying drawings.

Hereinafter, a concrete embodiment according to an embodiment of the present invention will be described with reference to the attached drawings.

Figure 1:
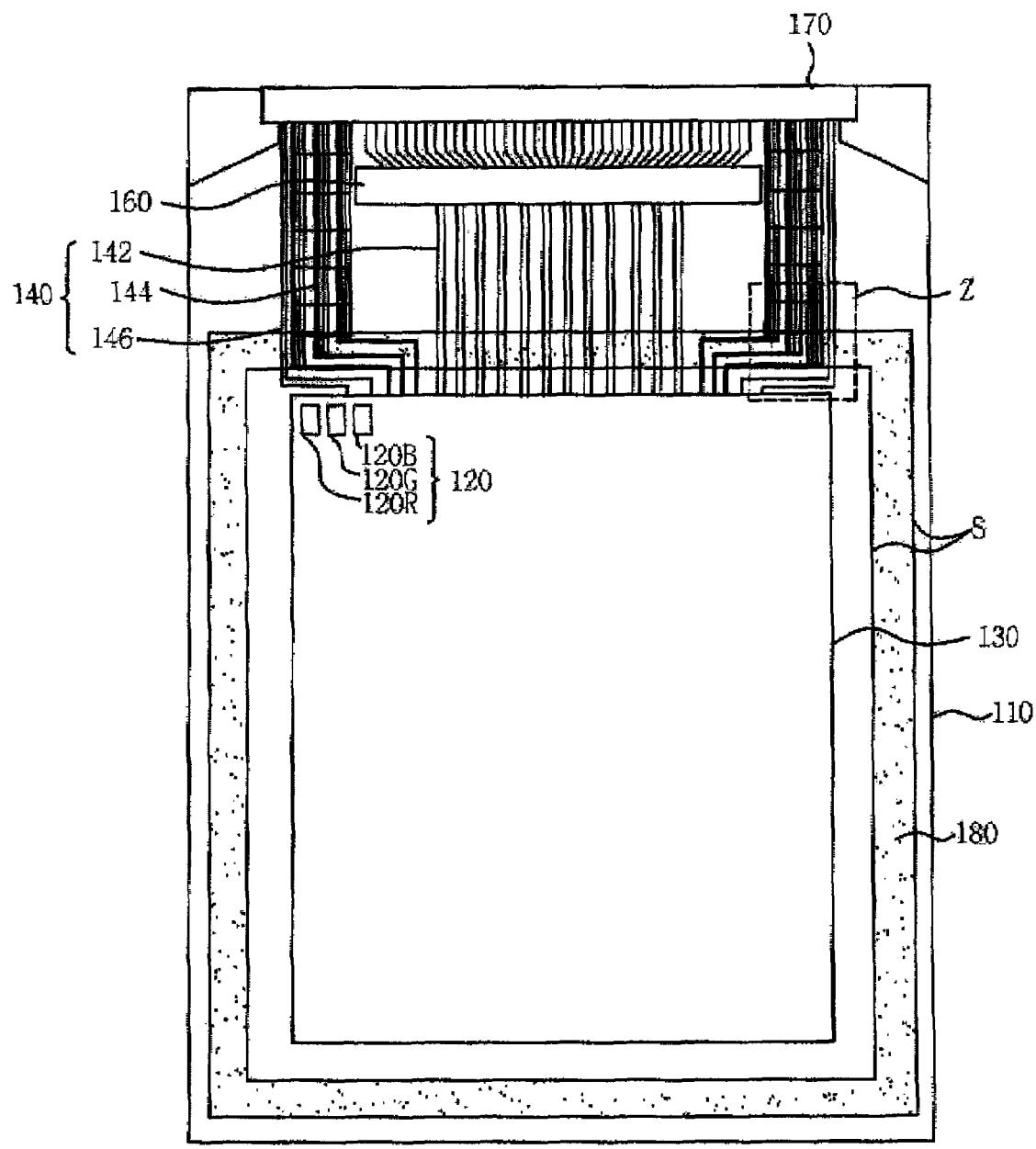
FIG. 1 is a schematic plane view of an organic electroluminescent device according to one embodiment of the present invention.

As shown in FIG. 1, an organic electroluminescent device according to one embodiment of the present invention has a display unit 130 including a plurality of subpixels 120 located on a substrate 110.

In the subpixels 120 included in the display unit 130, an organic light emitting layer is located between the anode and cathode connected to the source or drain of a driving transistor included in a transistor array located on the substrate 110. For reference, the aforementioned transistor array comprises one or more transistors and capacitors in regions corresponding to the subpixels 120.

The subpixels 120 included in the display unit 130 is defined as red, green, and blue subpixels 120R, 120G, and 120B. These subpixels may be defined as one pixel unit.

In the illustrated drawings, one subpixel 120 comprises only red, green, and blue, this is only one example of the embodiment and the subpixel 120 may be comprised of four or more by further including an emission color, such as white. Also, another color (e.g., orange, yellow, etc.) may be emitted.

For reference, the subpixel 120 includes at least an organic light emitting layer, at least an emission layer, and may further include a hole injection layer, a hole transport layer, an electron transport layer, and an electron injection layer. Additionally, a buffer layer, a blocking layer, and so on may be further included to adjust the flow of holes or electrons between the anode and cathode.

A sealing line S forming the sealing member 180 is located on the substrate 110 at the outer periphery of the display unit 130 so that a sealing process can be performed so as to protect the device from the outside. Here, the sealing line S is a virtual space defined so as to form the sealing member 180, and, as illustrated in the drawing, is also a position where the sealing member 180 is actually formed.

Meanwhile, a plurality of wiring lines 140 connected to the subpixels 120 are wired on the substrate 110 at the lateral side of the display unit 130. Specifically, some of the plurality of wiring lines 140 are wired so as to be respectively divided into two or more in the sealing region S.

Here, the plurality of wiring lines 140 comprise first power lines (e.g., VDD) 146 for supplying positive power to the subpixels 120, second power lines (e.g., GND) 144 for supplying low power less than a positive power, data lines 142 for supplying data signals to the subpixels 120, and scan lines (not shown) for supplying scan signals.

Meanwhile, a driving unit 160 is located on the substrate 110 at the lateral side of the display unit 130, and a pad unit 170 is located at the outer periphery of the substrate 110 of the region adjacent to the driving unit 160.

Here, the pad unit 170 is used for the purpose of connection with an external device, and the driving unit 160 serves to drive a signal supplied from the pad unit 170 and supply it to the subpixels 120 located within the display unit 130.

Among the above-described plurality of wiring lines 140, the scan lines (not shown) and the data lines 142 are connected to the driving unit 160 to transmit a signal supplied from an external device to the display unit 130.

For reference, the driving unit 160 may be divided into a scan driving unit for supplying scan signals to the respective subpixels 120R, 120G, and 120B included in the display unit 130 and a data driving unit for supplying data signals to the scanned subpixels 120R, 120G, and 120B. Although the positions of the scan driving unit and data driving unit are not illustrated in detail, the scan driving unit may be positioned at the left or right side of the lateral surface of the display unit the data driving unit may be positioned at the upper or lower side of the lateral surface of the display unit 130.

The divisional arrangement of some of the plurality of wiring lines 140 will be described hereinafter in further detail, and it should be noted that the illustrated plurality of wiring lines 140 are arbitrarily wired only for the explanation of the embodiment, but not limited thereto. In addition, some of the plurality of wiring lines 140 that are divided may not be further divided but may be wired with the original wiring width when being connected to the pad unit 170 subsequent to the sealing line S.

Accordingly, among the plurality of wiring lines 140, the divided wiring lines may be divided only within the sealing line S, or may be wired with the original wiring width in a specific region subsequent to the sealing line S.

It is advantageous that the width of the wiring lines positioned within the sealing line S, among the plurality of wiring lines 140, is kept at 5 to 50% of the thickness before division. Therefore, the width of the wiring lines positioned within the sealing line S may be 5 to 50 μm.

If the width of the wiring lines is smaller than the range from about 5 μm to about 50 μm, the wiring resistance rises and thus power consumption also rises, and this leads to a decrease in luminosity due to signal distortion. Further, if the width of the wiring lines is larger than the range from about 5 μm to about 50 μm, the sealing member 180 to be formed on the sealing line S may not be hardened.

An example of the circuit configuration of the subpixels 120 included in the display unit 130 of FIG. 1 will be described with respect to FIG. 2, but the present invention is not limited to this example.

Figure 2:
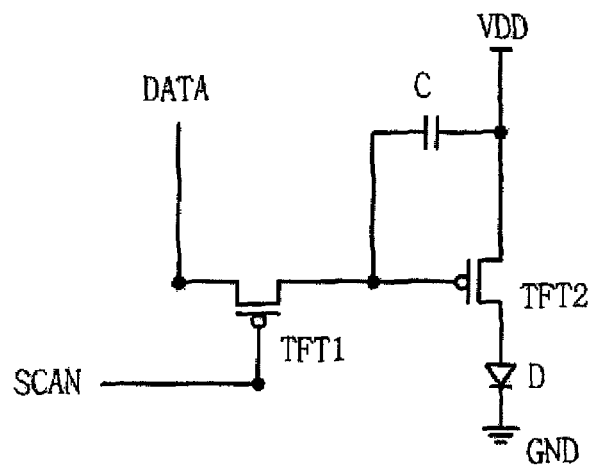
FIG. 2 is an illustration of the circuit configuration of a subpixel of FIG. 1.

Referring to FIG. 2, in the circuit configuration of a subpixel, the subpixel comprises a switching transistor TFT1, whose gate is connected to scan lines SCAN, and whose first electrode is connected to data lines DATA. Further, the subpixel comprises a driving transistor TFT1, whose gate is electrode to a second electrode of the switching transistor TFT1, and whose first electrode is connected to first power lines VDD. The subpixel comprises a capacitor C which is connected between the driving transistor TFT2 and the first power lines VDD. Further, the subpixel comprises an organic light emitting diode D which is connected between a second electrode of the driving transistor TFT2 and second power lines GND.

In one subpixel having such a circuit configuration as described with reference to FIG. 1, as a signal having entered into the driving unit 160 through the pad unit 170 is supplied to the scan lines SCAN and data lines DATA of FIG. 2 and the selected transistors TFT1 and TFT2 are driven, the organic light emitting diode D emits light. Here, the first power lines VDD and second power lines GND correspond to the first power lines 146 and second power lines 144 as illustrated in FIG. 1.

Although the transistors TFT1 and TFT2 included in the subpixel can be driven in a linear region or a saturation region by a signal supplied from the driving unit, it is advantageous that the organic electroluminescent device according to the present invention employs a digital driving method for driving the transistors TFT1 and TFT2 included in the subpixel in a linear region. Here, the digital driving method refers to a method of driving an organic light emitting diode D by simply turning on or off transistors.

Hereinafter, referring to FIGS. 3 and 4, among the first and second power lines 144 and 146 which are part of the plurality of wiring lines, the second power lines 144 having the largest wiring width are selected as an example, and the structure of the second power line 144 will be described in more detail.

Figure 3:
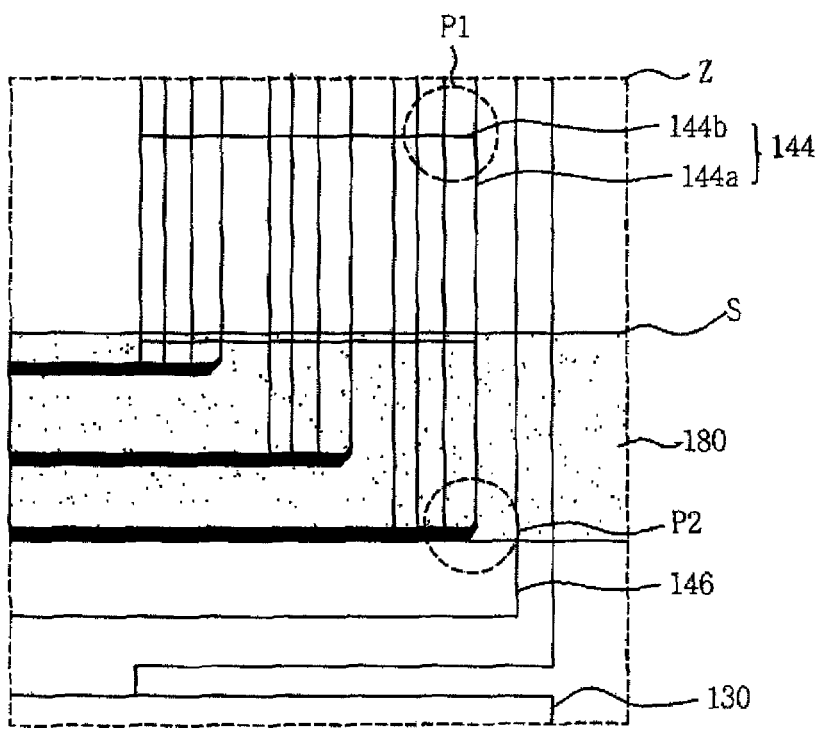
FIG. 3 is an enlarged view of a "Z" region of FIG. 1.

Referring to FIG. 3, it can be seen that the second power lines 144 positioned within the sealing region S where the sealing member 180 is positioned are wired as one unit in a transverse direction while they are divided into two or more and wired in a longitudinal direction. "130" denotes a display unit.

Typically, the second power lines 144 which are part of the plurality of wiring lines is thicker than the first power lines 146 or other signal lines (scan lines, data lines). Therefore, the second power lines 144 positioned within the sealing region S in the conventional art occupy a wide area, and this makes it difficult to uniformly applying the sealing member 180. However, if the second power lines 144 occupying a wide area within the sealing region S are divided into two or more, the sealing member 180 can be applied more uniformly within the sealing region S.

If the sealing 180 is a material, such as sealant, which needs to be hardened by UV irradiation, the effect of this wiring structure is further improved, thus further increasing airtightness in the sealing of the device.

Moreover, referring to "PI" region of FIG. 3, it can be seen that connecting lines 144b for connecting between the divided second power lines 144a are located at some or entire part of the second power lines 144.

The second power lines 144 may cause wiring resistance or interference according to the wiring structure. However, if a connecting line 144b is placed so as to connect between the divided second power lines 144a, the resistance problem or the problem of concentration of the load flowing through the wiring lines can be solved.

Meanwhile, when some or entire part of the second power lines 144 may be wired in a manner that corner regions are bent twice when wired at an angle of 90°.

Referring to "P2" region of FIG. 3, it is advantageous that the angle of the corner regions of the wiring lines wired so as to be bent within the sealing region S, among the second power lines 144, is greater than 90° and less than 180°. It is advantageous for other regions, as well as the sealing region S, to have such a wiring width. More specifically, in a case where thee second power lines 144 are wired on the substrate 110, the more perpendicular, i.e., the closer to 90° the angle at which the wiring lines are bent, the more affected by a load the second power lines 144. To avoid this problem, the second power lines 144 are wired to be bent not once but twice. However, when they are wired at an angle greater than 180°, the distance for routing the wiring lines becomes wider. Thus, the wiring should be done with caution.

When the second power lines 144 are wired by bending as above, it is advantageous that the angle at which the wiring lines are bent is greater than 90° and less than 140° in order to ensure maximum routing efficiency on the confined substrate 110. Moreover, if the second power lines 144 are wired in a manner that they are bent twice at both sides, the effect of UV or laser irradiated for hardening the sealing member 180 within the sealing region S can be minimized.

Figure 4:
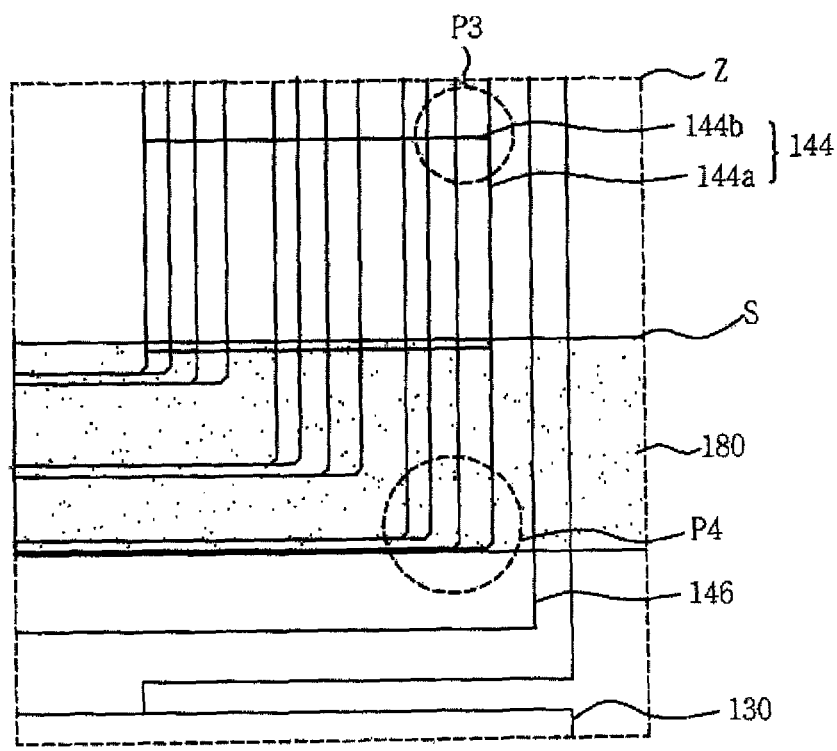
FIG. 4 is an illustration of another implementation of the "Z" region of FIG. 3.

Referring to "P4" region of FIG. 4, it can be seen that the second power lines 144 positioned within the sealing region S where the sealing member 180 is positioned are divided in a transverse direction and they are divided into two or more and wired in a longitudinal direction as well. The "P3" region is identical to the above-described "P1" region of FIG. 3. "130" denotes a display unit.

In this structure, especially in a case where the second power lines 144 are positioned within the sealing region S even after they are divided, some or entire part of the plurality of wiring lines are wired so as to be sub-divided in another direction. Meanwhile, some or entire part of the second power lines 144 can be wired in a manner that corner regions are bent twice when wired at an angle of 90°.

Although similar to the above description made with reference to FIG. 3, another embodiment has a structure in which the second power lines 144 divided into two or more in the sealing region S are sub-divided into two or more when they are bent in another direction.

Meanwhile, in some or entire part of the second power lines 144, both corner regions where the wiring lines are bent may have a wiring width of an obtuse or acute angle. However, it is advantage that they are wired at an acute wiring angle only when wired in a specific region, i.e., confined space, and they are wired at a wiring angle of an obtuse angle in other regions, in order to reduce the effect of the load.

Figure 5:
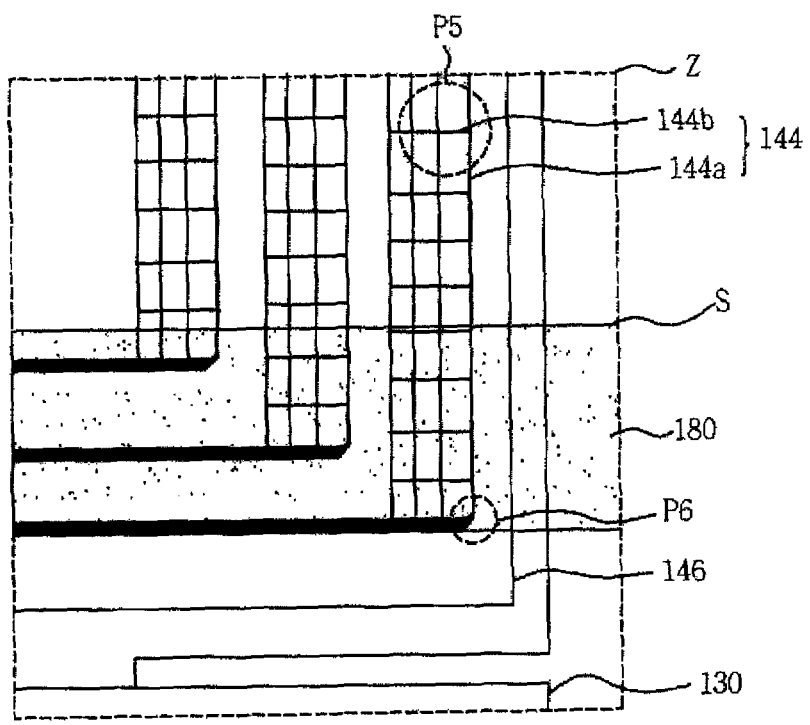
FIG. 5 is an illustration of still another implementation of the "Z" region of FIG. 3.

Referring to "P5" region of FIG. 5, it can be seen that when the second power lines 144 positioned within the sealing region S where the sealing member 180 is positioned are divided, second power lines 144a divided in a longitudinal direction and connecting lines 144b for connecting between the second power lines 144a to be divided in a predetermined section are positioned. Though "P6" region has the same shape as the above-described "P2" region of FIG. 3, it may have the same shape as the "P4" region of FIG. 4. "130" denotes a display unit.

Such a structure is for solving the problem of signal interference or resistance of the divided second power lines 144a positioned within the sealing region S. Accordingly, the divided second power lines 144a and the connecting lines 144b has to be positioned in a predetermined section from each other in order to reduce interference or a resistance difference which may be a problem in signal transmission.

Meanwhile, the second power lines 144a thus divided and the connecting lines 144b may be formed in the following manner in order to reduce interference or a resistance difference which may be a problem in signal transmission and increase the hardening efficiency of the sealing member.

Referring to FIG. 6, as described above, with regard to the wiring width a3 and b3 of the second power lines 144a and of the connecting lines 144b, it is advantageous that the width of the wiring lines positioned within the sealing line S may range from about 5 to about 50 μm because the thickness of the wiring lines positioned within the sealing line S, among the plurality of wiring lines 140, is kept at 5 to 50% of the thickness thereof before division. A space a2 and b2 is a space which is formed by the second power lines 144a divided in a longitudinal direction adjacent to each other and the connecting lines 144b for connecting the second power lines 144a in a transverse direction.

Meanwhile, in the present invention, wiring is done such that the distance of "a1" and "b1" may have a range from about 100 μm to about 500 μm. This is for consideration of the two problems: the problem caused by a wiring structure and the problem of hardening of the sealing member. Here, if the distance of "a1" and "b1" has a range less than about 100 μm, this is effective in that wiring resistance can be reduced and problems caused in signal transmission can be solved, but not effective in terms of hardening the sealing member. On the other hand, if the distance of "a1" and "b1" has a range greater than about 500 μm, this is effective in terms of hardening the sealing member, but not effective for wiring resistance and problems caused in signal transmission. Like this, the distance of "a1" and "b1" is ambivalent, and hence this ambivalence should be taken into account in design.

Accordingly, at the time of designing the second power lines, as described above, the divided wiring lines 144a and the connecting lines 144b are designed so as to have a wiring range of a1(or b1)−a3 (or b3)≤a2(or b2)≥a1(or b1)−a3(or b3).

Here, a1 (or b1) is the distance between the divided wiring lines (or connecting lines), a2 (or b2) is the distance obtained by subtracting a3 (or b3) from a1 (or b1), and a3 (or b3) is the width between the wiring lines. As described above, a1 (or b1) may have a range from about 100 μm to about 500 μm, and a3 (or b3) may have a range from about 5 μm to about 50 μm.

According to this range of numerical values, the volume of the space formed in the section in which the divided wiring lines 144a and the connecting lines 144b intersect each other is obtained by multiplying the divided wiring lines by the connecting lines. It is advantageous to taken the properties of a sealing material into account when obtaining the volume.

As above, the device can be more hermetically sealed by differentiating the wiring structure of the organic electroluminescent device, and the display quality can be enhanced by solving the problem of the load concentrated on the power lines. Meanwhile, the one embodiment of the present invention has been described with respect to the differentiation of the structure of the power lines, any wiring lines having such a wiring width as to affect the hardening of the sealing member are applicable. Furthermore, the connecting wiring structure of the present invention for solving the problem of the load concentrated on the wiring lines for transmitting the same power or signal is not limited to the power lines.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such as limitation is not intended to be interpreted under 35 USC 112 (6).

What is claimed is:

1. An organic electroluminescent device, comprising:
a substrate;
a display unit located on the substrate and including a plurality of subpixels;
a sealing region located at the outer periphery of the display unit and defined to form a sealing member; and
a plurality of wiring lines connected to the display unit and disposed on the lateral side of the display unit,
wherein some of the plurality of wiring lines are power lines, the power lines each including a first section extending along a longitudinal direction of the display unit and a second section extending along a transverse direction perpendicular to the longitudinal direction, the first section being divided into divided wiring lines, the divided wiring lines being arranged to form a plurality of groups, the divided wiring lines that are divided from a same power line forming a same group, the divided wiring lines of each group being closely arranged such that no divided wiring line in one group is disposed between any two of the divided wiring lines of another groups, the divided wiring lines of the same group being connected to a corresponding one of the second sections to form an L-shape and to define an angle greater than 90° and less than 140°, the divided wiring lines of the same group each having an end terminated at the corresponding one of the second sections such that power for each power line is divided by and delivered through the divided wiring lines of the same group and the divided power delivered through the divided wiring lines is merged at the corresponding one of second sections before the power is delivered to the display unit, wherein connecting lines for connecting the divided wiring lines are located at some or all of the power lines.

2. The organic electroluminescent device, wherein the power lines comprise the divided wiring lines and the connecting lines for connecting the divided wiring lines, wherein the divided wiring lines have a wiring range of $a1-a3 \leq a2 \geq a1-a3$, and the volume thereof is obtained by multiplying the divided wiring lines by the connecting lines, $a1$ is the distance between the divided wiring lines, $a2$ is the distance obtained by subtracting $a3$ from $a1$, and $a3$ is the width between the wiring lines, and $a1$ has a range from 100 μm to 500 μm, and $a3$ has a range from 5 μm to 50 μm.

3. The organic electroluminescent device, wherein the power lines comprise the divided wiring lines and the connecting lines for connecting the divided wiring lines, wherein the divided wiring lines have a wiring range of $b1-b3 \leq b2 \geq b1-b3$, and the volume thereof is obtained by multiplying the divided wiring lines by the connecting lines, $b1$ is the distance between the divided wiring lines, $b2$ is the distance obtained by subtracting $b3$ from $b1$, and $b3$ is the width between the wiring lines, and $b1$ has a range from 100 μm to 500 μm, and $b3$ has a range from 5 μm to 50 μm.

4. The organic electroluminescent device of claim 1, wherein the subpixels comprises one or more capacitors and transistors.

5. The organic electroluminescent device of claim 1, wherein the power lines are ground voltage lines which are thicker than positive voltage lines.

6. The organic electroluminescent device of claim 1, wherein the second sections of the power lines are disposed in the sealing region and are spaced apart along the longitudinal direction of the display unit.

7. The organic electroluminescent device of claim 1, wherein the second section of each of the power lines is a single wiring line which is wider than the divided wiring lines.

8. The organic electroluminescent device of claim 1, wherein the second sections of the power lines each include a plurality of wider wiring lines wider than the divided wiring lines, each of the wider wiring lines connected to at least two of the divided wiring lines.

9. The organic electroluminescent device of claim 1, wherein the divided wiring lines are disposed only in the sealing region.

10. The organic electroluminescent device of claim 1, wherein the second sections of the power lines comprise two or more divided wiring lines.

11. The organic electroluminescent device of claim 1, wherein the sealing region includes a pair of longitudinal sides and a pair of transverse sides that are shorter than the pair of the longitudinal sides, and wherein the divided wiring lines extend from outside the substrate to one of the transverse sides of the sealing region.

12. The organic electroluminescent device of claim 11, wherein the second sections are disposed in the one of the transverse sides of the sealing region and parallel to the one of the transverse sides of the sealing region.

13. The organic electroluminescent device of claim 1, wherein the second section of each group is thicker than each of the divided wiring lines of the same group.

14. The organic electroluminescent device of claim 1, wherein the divided wiring lines of the same group do not extend beyond the corresponding one of the second sections.

15. The organic electroluminescent device of claim 1, wherein the divided wiring lines of the same group are connected to one single second section.

16. An organic electroluminescent device, comprising:
a substrate;
a display unit on the substrate and including a plurality of subpixels, the display unit defining a longitudinal direction and a transverse direction perpendicular to the longitudinal direction;
a sealing region located at the outer periphery of the display unit;
a first power line including a plurality of divided wiring lines extending along the longitudinal direction from outside the substrate to the sealing region, and a single second section extending along the transverse direction from the plurality of divided wiring lines, wherein the plurality of divided wiring lines of the first power line each have an end terminated at the single second section of the first power line such that power for the first power line is first divided by the divided wiring lines and delivered through the divided wiring lines of the first power line and the divided power delivered through the divided wiring lines of the first power line is merged at the single second section of the first power line before the power is delivered to the display unit; and
a second power line including a plurality of divided wiring lines extending along the longitudinal direction from outside the substrate to the sealing region, and a single second section extending along the transverse direction, wherein the plurality of divided wiring lines of the second power line each have an end terminated at the single second section of the second power line such that power for the second power line is divided by and delivered through the divided wiring lines of the second power line, and the divided power delivered through the divided wiring lines of the second power is merged at the single second section of the second power line before the power is delivered to the display unit.

* * * * *